(12) United States Patent
Chen et al.

(10) Patent No.: US 11,552,064 B2
(45) Date of Patent: Jan. 10, 2023

(54) DISPLAY WITH STRETCH-RESISTANT UNITS AND MANUFACTURING METHOD THEREOF

(71) Applicants: Interface Technology (ChengDu) Co., Ltd., Sichuan (CN); Interface Optoelectronics (ShenZhen) Co., Ltd., Guangdong (CN); General Interface Solution Limited, Miaoli County (CN)

(72) Inventors: Po-Lun Chen, Miaoli County (TW); Chun-Ta Chen, Miaoli County (TW); Po-Ching Lin, Miaoli County (TW)

(73) Assignees: INTERFACE TECHNOLOGY (CHENGDU) CO., LTD., Sichuan (CN); INTERFACE OPTOELECTRONICS (SHENZHEN) CO., LTD., Guangdong (CN); GENERAL INTERFACE SOLUTION LIMITED, Miaoli County (TW)

( * ) Notice: Subject to any disclaimer, the term of this patent is extended or adjusted under 35 U.S.C. 154(b) by 132 days.

(21) Appl. No.: 17/147,729

(22) Filed: Jan. 13, 2021

(65) Prior Publication Data

US 2022/0199596 A1    Jun. 23, 2022

(30) Foreign Application Priority Data

Dec. 22, 2020   (CN) .......................... 202011527842.4

(51) Int. Cl.
  *H01L 25/16*    (2006.01)
  *H01L 27/12*    (2006.01)
  *H01L 27/32*    (2006.01)
  *H01L 51/00*    (2006.01)
  *H01L 51/56*    (2006.01)

(52) U.S. Cl.
  CPC ........ *H01L 25/167* (2013.01); *H01L 27/1259* (2013.01); *H01L 27/1266* (2013.01); *H01L 27/32* (2013.01); *H01L 27/3211* (2013.01); *H01L 27/3276* (2013.01); *H01L 51/0097* (2013.01); *H01L 51/56* (2013.01); *G09G 2380/02* (2013.01)

(58) Field of Classification Search
  None
  See application file for complete search history.

(56) References Cited

U.S. PATENT DOCUMENTS

| | | | |
|---|---|---|---|
| 2021/0064167 A1* | 3/2021 | Hsu | G10L 15/22 |
| 2021/0408204 A1* | 12/2021 | Zhao | H01L 27/3276 |
| 2022/0013696 A1* | 1/2022 | Kang | H01L 33/005 |

* cited by examiner

*Primary Examiner* — J. E. Schoenholtz
(74) *Attorney, Agent, or Firm* — Locke Lord LLP; Tim Tingkang Xia, Esq.

(57) ABSTRACT

The present invention is a display and manufacturing method thereof, including a thin film substrate, a plurality of packaging layers, and a stretch-resistant unit, wherein one side of the thin film substrate has a plurality of pixel areas, each pixel area contains at least one light-emitting element, and each packaging layer respectively covers one of the pixel areas to form an island-shape structure, and there is a spacing between any two adjacent island-shape structures, and each stretch-resistant unit deposed at the spacing and connects the adjacent island-shape structures.

14 Claims, 17 Drawing Sheets

DISPLAY WITH STRETCH-RESISTANT UNITS AND MANUFACTURING METHOD THEREOF

REFERENCE TO RELATED APPLICATIONS

The present application is based on, and claims priority from, Chinese application number 202011527842.4, filed Dec. 29, 2020, the disclosure of which is hereby incorporated by reference herein in its entirety.

BACKGROUND OF THE INVENTION

1. Field of the Invention

The present invention relates to a display and a manufacturing method thereof, in particular to a stretch-resistant display and a manufacturing method thereof.

2. Description of the Related Art

Accordingly, light-emitting diodes (LED), especially for Micro LED, are regarded as a new generation of display technology and the overlord of the next generation display technology. Many domestic and foreign manufacturers have invested in the development and production of this product, and its market prospects are highly promising. High brightness, low power consumption, ultra-high resolution and color saturation are the advantages of LED products, and the significant advantage is the micron-level spacing, which can control every pixel of the display at certain point and drive the light-emitting at the single-point.

Furthermore, for flexible displays, the advantages of using of inorganic materials for LEDs are long service life and simple structure. However, in the conformal manufacturing process or application, the component interface may be split due to the stress. In the conformal manufacturing process, since the stress the LED bears is not from a single direction, the LED may not be able to withstand the stress and then cause splitting during the manufacturing process. Please refer to FIG. 1, because the LED 100 is arranged on the substrate 102 of the flexible display in the form of a laminated structure, the LED 100 is easy to deviate from the neutral plane (NP) of the substrate and causes the damage to the LED when the conformal display (or flexible display) is actually used in bending behavior.

According to the above, an urgent problem to be addressed is to reduce the stress in all directions on the LED of conformal display (or flexible display), avoid splitting and component damage as the result of the intentional deviation of the LED from the neutral plane when the bending occurs.

SUMMARY OF THE INVENTION

In view of the problems of the prior art, the purpose of the present invention is to provide a stretch-resistant structure on the substrate of the display to reduce the stress during the stretching process and achieve the purpose of improving the stretch-resistant.

According to the object of the present invention, a display is disclosed, comprising a thin film substrate, packaging layers, and a stretch-resistant unit, wherein one side of the thin film substrate has pixel areas, each pixel area contains at least one light-emitting element, and each packaging layer respectively covers one of the pixel areas to form an island-shape structure, and there is a spacing between any two adjacent island-shape structures, and each stretch-resistant unit deposed at the spacing recited previously and connects the adjacent island-shape structures.

In the present invention, each of the plurality of stretch-resistant units comprises at least one wire, and each of the plurality of wires extends into the island-shape structure and connects the plurality of light-emitting elements therein.

In the present invention, each of the plurality of pixel areas comprises sub-pixel portions, and each of the plurality of sub-pixel portions is provided with a blue light-emitting element, a green light-emitting element, and a red light-emitting element. Each of the first electrodes of the plurality of light-emitting elements with same color in the different sub-pixel portions of the pixel areas are connected to each other to form first connecting units, and each of the second electrodes of the plurality of light-emitting elements with different colors in the same sub-pixel portions of the pixel areas are connected to each other to form second connection units. Each of the first connection unit and each of the second connection unit are respectively connected to one of the plurality of wires recited previously.

In the present invention, each of the plurality of stretch-resistant units is a metal wire in a repetitively curved shape, or each of the plurality stretch-resistant units is a metal wire with wavy shapes on both sides by expanding reaming holes to the edge of both sides of a linear metal wire.

In the present invention, each of the plurality stretch-resistant units has a patterned area surrounding the stretch-resistant unit.

In the present invention, the patterned area is a sink and each wire is accommodated in the sink. The patterned area is either perforations or pits.

In the present invention, the thin film substrate is connected to a substrate by an adhesive layer.

In the present invention, the adhesive layer has weak adhesiveness areas corresponding to the plurality of stretch-resistant units and wherein the adhesiveness of the plurality of weak adhesiveness areas is lower than that of other parts of the adhesive layer.

In the present invention, the surface of the plurality stretch-resistant unit is provided with a repair particle layer. The repair particle layer is composed of a conductive glue and repair particles, and the repair particle comprises a shell and a core, and the core is wrapped in the shell.

In the present invention, each of the plurality of stretch-resistant units and each of the plurality of wires connected thereto are composed of a conductive glue and repair particles. Repair particle comprises a shell and a core, and the core is wrapped in the shell.

According to the object of the present invention, a display manufacturing method is disclosed and comprises the following steps: connecting the other side of the thin film substrate to the substrate by an adhesive layer and arranging a patterned area respectively around each of the plurality stretch-resistant units.

In the present invention, remove a preset carrier board on the other side of the thin film substrate before the thin film substrate is connected to a substrate by an adhesive layer, In the present invention, before the adhesive layer is connected to the thin film substrate, the adhesive layer is connected to corresponding positions of the plurality of stretch-resistant units to form a weak adhesiveness area by a adhesiveness reduction process, and the adhesiveness of the plurality of weak adhesiveness area is lower than that of other parts of the adhesive layer. The adhesiveness reduction process is by etching or lasering.

In the present invention, a removal process is used to remove the adhesive layer around each stretch-resistant unit and to form the patterned area.

In the present invention, the surface of the plurality stretch-resistant units is coated with a repair particle layer.

In the present invention, the repair particle layer is composed of a conductive glue and repair particles. Repair particle comprises a shell and a core. The core is wrapped in the shell. The core is made of non-conductive material and the shell is made of conductive material.

In the present invention, each of the stretch-resistant unit and the connected wire are formed by coating a thin film substrate with a conductive glue containing repair particles. Repair particle comprises a shell and a core. The core is wrapped in the shell. The core is made of non-conductive material and the shell is made of conductive material.

In summary, in the subsequent shaping (stretching) process of the display manufacturing, the stretch-resistant unit is used to improve the stretch resistance. The patterned area can further reduce the stress on the stretch-resistant unit and increase the overall structural strength of the stretch-resistant unit. In addition, when each stretch-resistant unit is over-stretched and broken into a disconnected state, the repair particle layer repairs the stretch-resistant unit and restored it to a connected state.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PREFERRED EMBODIMENTS

In order to make the objectives, technical solutions, and advantages of the present invention clearer, the following further describes the present invention in detail with reference to the accompanying drawings and embodiments. It is noted that the embodiments described here are only used to illustrate the present invention, but not used to limit the present invention.

Figure 1:
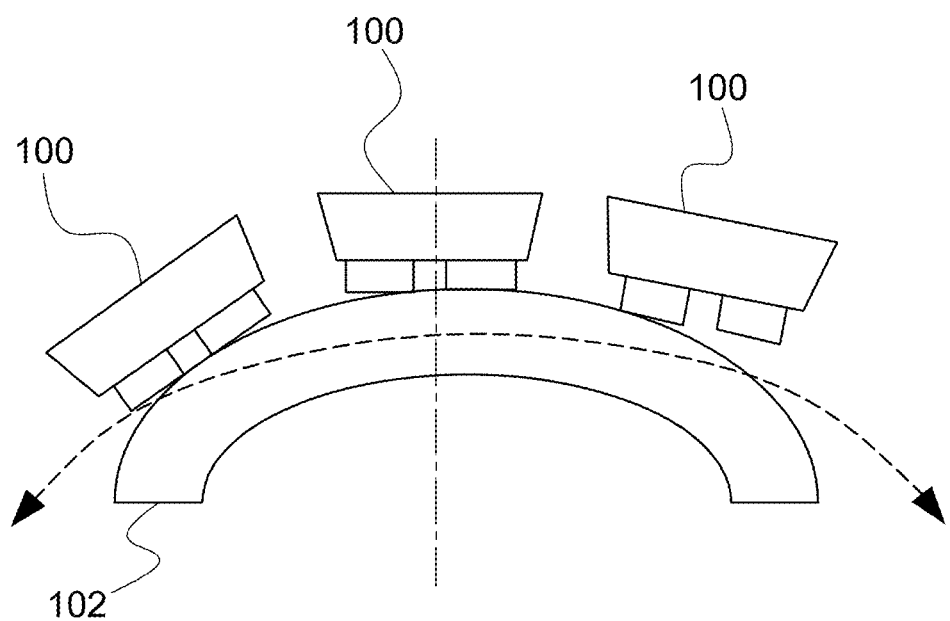
FIG. 1 is a schematic diagram of the prior art light emitting diode deviating from the neutral plane on the substrate.
Figure 2:
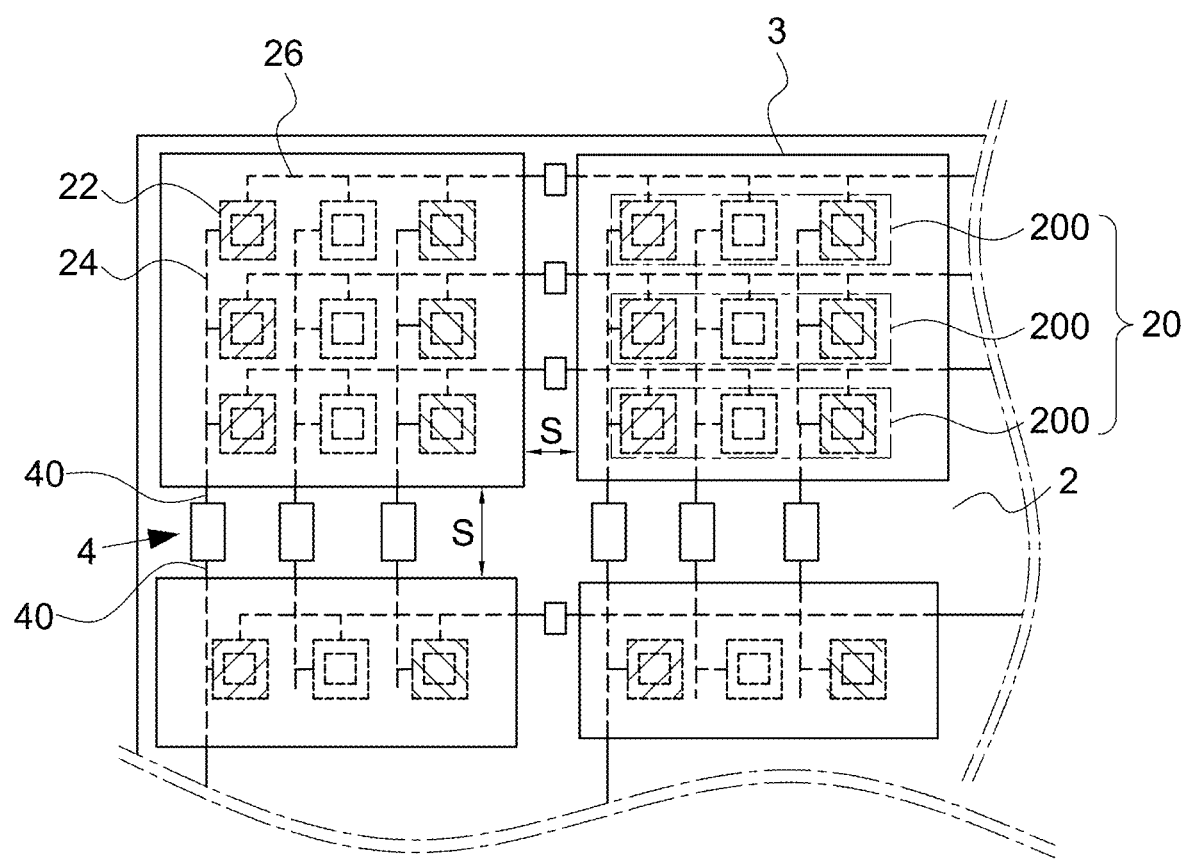
FIG. 2 is a schematic plan view of the present invention.

Refer to FIG. 2, the present invention is a display, comprising a thin film substrate 2, packaging layers 3 and a stretch-resistant unit 4. The thin film substrate 2 is a dielectric layer of a thin-film transistor. One side of the substrate 2 has pixel areas 20, and each pixel areas 20 comprises at least one light-emitting element and provide a required light source. Each packaging layer 3 respectively covers one of the pixel areas 20 and forms an island-shape structure respectively. There is a spacing S between any two adjacent island-shape structures, and each stretch-resistant unit 4 is respectively arranged between the spacing S recited previously and connect the adjacent island-shape structure. In this way, the stretch resistance unit 4 reduces the shear stress from the stretching process and improve the stretch resistance.

Figure 3:
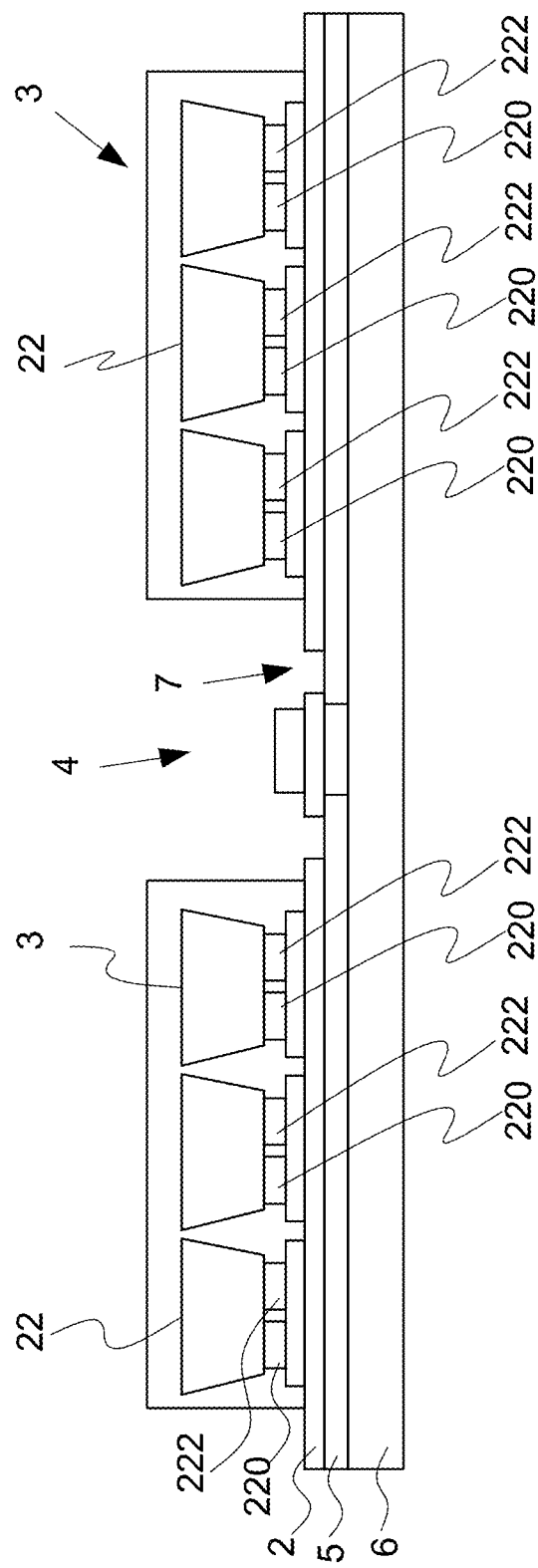
FIG. 3 is a cross-sectional schematic diagram of the present invention.

Refer to FIGS. 2 and 3, each stretch-resistant unit 4 comprises at least one wire 40, and each wire 40 extends into an adjacent island-shape structure and connects the light-emitting elements 22 therein. In addition, each pixel area 20 comprises sub-pixel portions 200, each sub-pixel portion 200 is provided with a blue light-emitting element, a green light-emitting element, and a red light-emitting element, respectively. The first electrodes 220 of the light-emitting elements with the same color in the different sub-pixel portions 200 of each pixel area are connected to each other to form first connecting units 24, and the second electrodes 222 of the light-emitting elements with different colors in the same sub-pixel portions 200 of each pixel area 20 are connected to each other to form second connecting units 26. Each first connecting unit 24 and each second connecting unit 26 are connected to one of the wires 40 recited previously.

Figure 4:
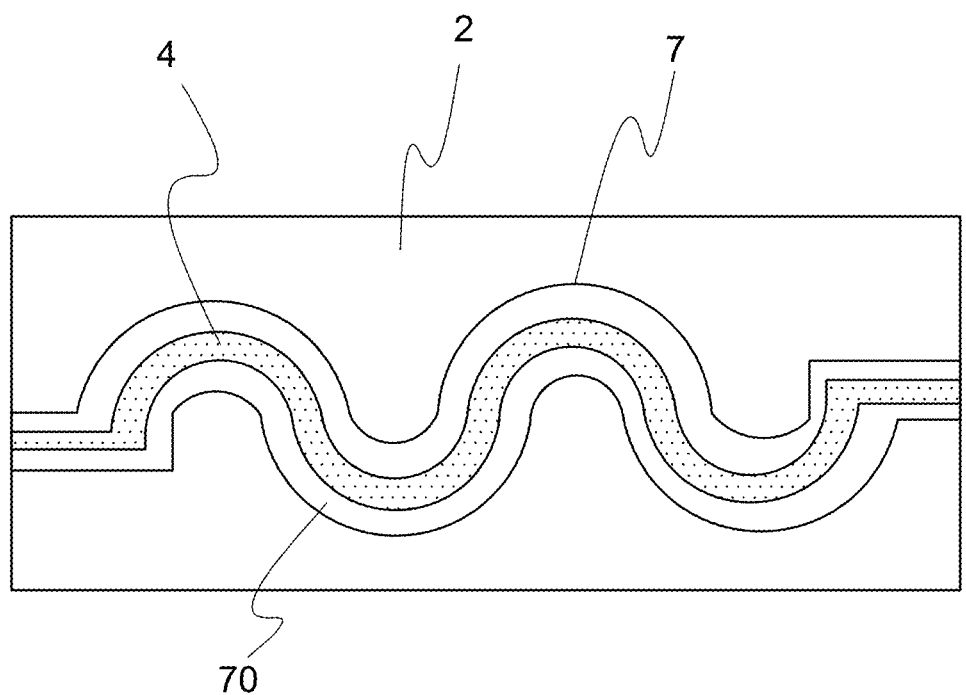
FIG. 4 is a schematic plan view of a stretch-resistant unit of the present invention.
Figure 5:
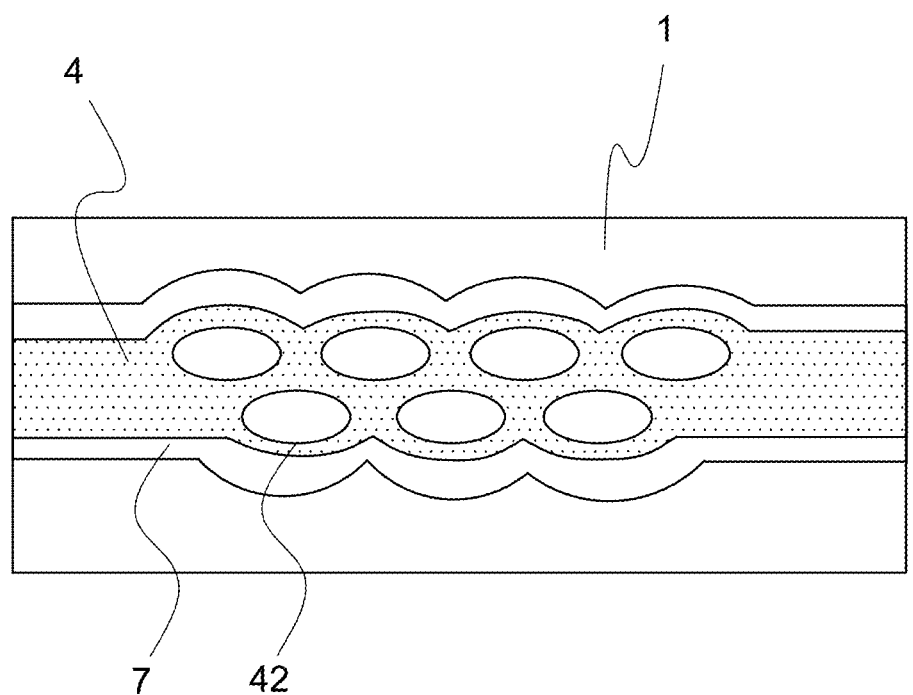
FIG. 5 is a schematic plan view of another stretch-resistant unit of the present invention.

Refer to FIG. 4, each stretch-resistant unit 4 is a metal wire with a repetitive curved shape, and the repetitive curved shape can be formed by continuous connection of an S-shape, a U-shape or a horseshoe shape. Please also refer to FIG. 5, each stretch-resistant unit 4 can also be a metal wire with wavy shape by extending the reaming holes 42 to the edge of both sides of the linear metal wire. Therefore, the shaping effect increases the stretch resistance of each stretch-resistant unit 4. In addition, the packaging layer 3 is made of a light-transmitting material such as polydimethylsiloxane (PDMS), acrylic, epoxy resin, silicone, etc. Furthermore, the light-emitting element 22 is a light-emitting diode element, especially a micro-light-emitting diode element (Micro LED).

Figure 6:
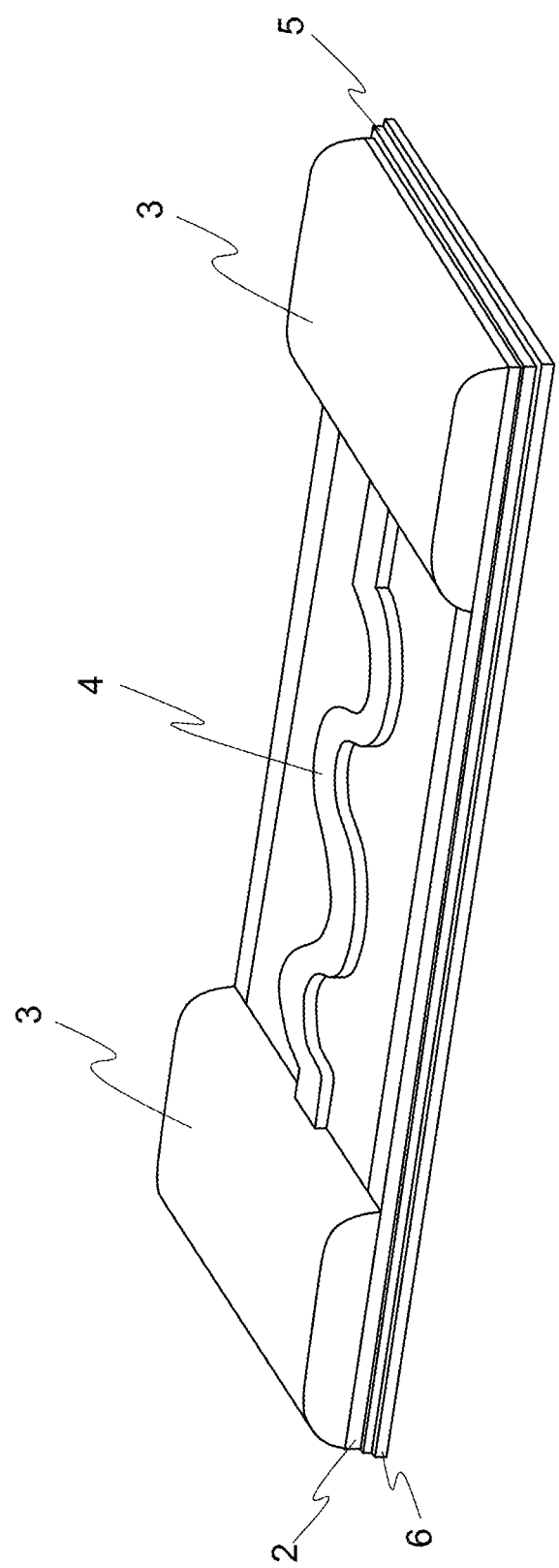
FIG. 6 is a three-dimensional schematic diagram of the present invention when the patterned area is not set.
Figure 7:
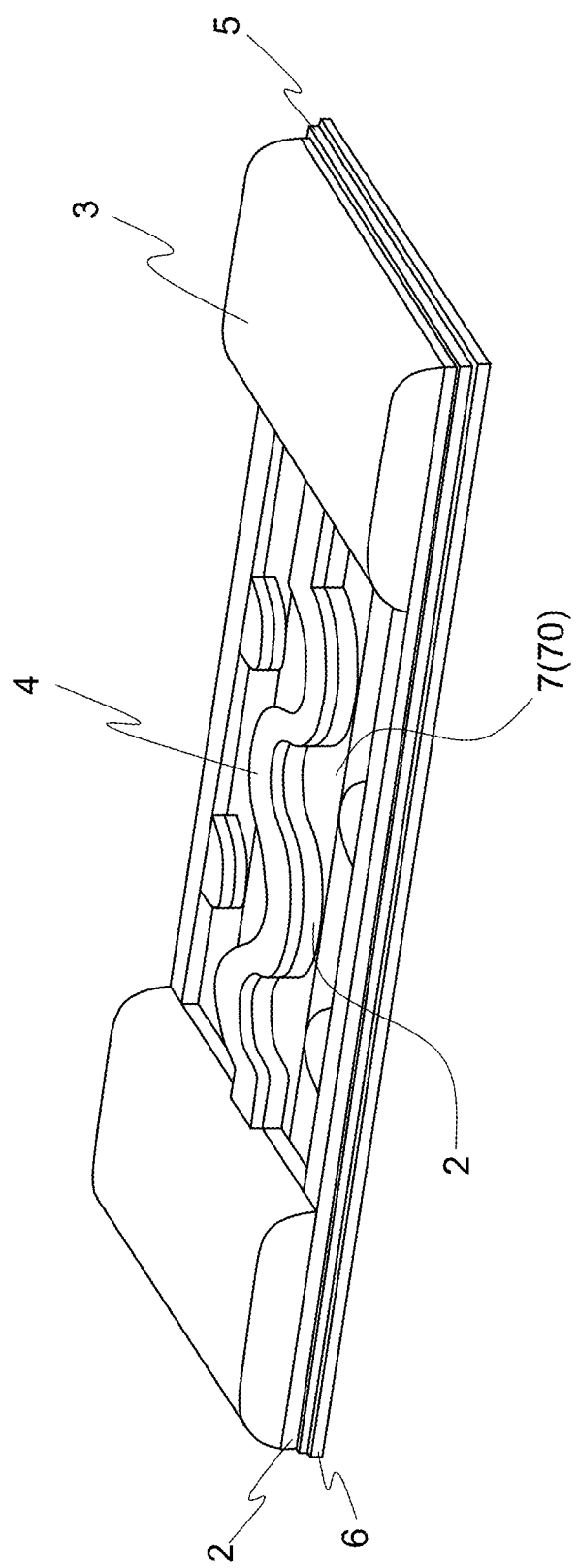
FIG. 7 is a three-dimensional schematic diagram of the patterned area of the present invention.

Refer to FIG. 6, the thin film substrate 2 is connected to the substrate 6 by the adhesive layer 5, and the substrate 6 is made of flexible circuit board or polymer materials. The polymer material is either polycarbonate (PC), polyethylene terephthalate (PET) or polyurethane (PU). However, because the stretch-resistant unit 4 is connected the thin film substrate 2 and the thin film substrate 2 is connected to the substrate 6, the stretch-resistant unit 4 is stretched along with the thin film substrate 2 and the substrate 6 when the display is stretched. It results in the limited stretch-resistance of stretch-resistant unit 4. Therefore, please refer to FIG. 7, each stretch-resistant unit 4 is surrounded by a patterned area 7 respectively. The patterned area 7 is a sink 70, and each stretch-resistant unit 4 is accommodated in the sink 70. The sink 70 is formed by removing the thin film substrate 2 surrounding stretch-resistant unit 4. The patterned area 7 is either perforations or pits. Each perforation or pit can be formed by removing the thin film substrate 2 or the substrate 6 surrounding each stretch-resistant unit 4 but is not limited to this. Any other ways to address the thin film substrate 2 and the substrate 6 on the stretch-resistant unit 4 is also a feasible embodiment of the patterned area 7 recited in the present invention.

Figure 8:
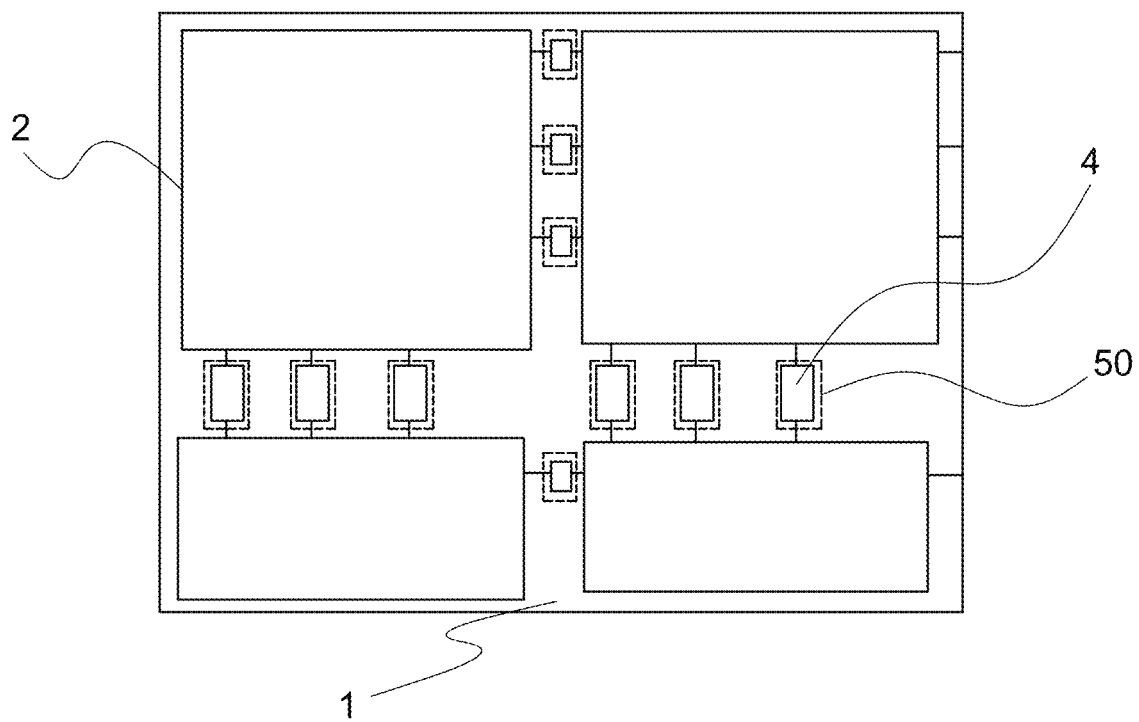
FIG. 8 is a schematic plan view of the weak adhesiveness area of the present invention.

Each patterned area 7 addresses the problem that the stretch-resistant unit 4 is limited by the thin film substrate 2 during the stretching process, but the stretch-resistant unit 4 will still be stretched by the thin film substrate 2 during the stretching process. The reason is that the thin film substrate 2 and the adhesive layer 5 are connected. In other words, the stretch resistance of the stretch-resistant unit 4 is still limited by the adhesive layer 5. Therefore, in the present invention, please refer to FIG. 8, the adhesive layer 5 is provided with weak adhesiveness areas 50 corresponding to each position of stretch-resistant unit 4, and the adhesiveness of each weak adhesiveness area 50 is lower than that of other parts of the adhesive layer 5.

Figure 10:
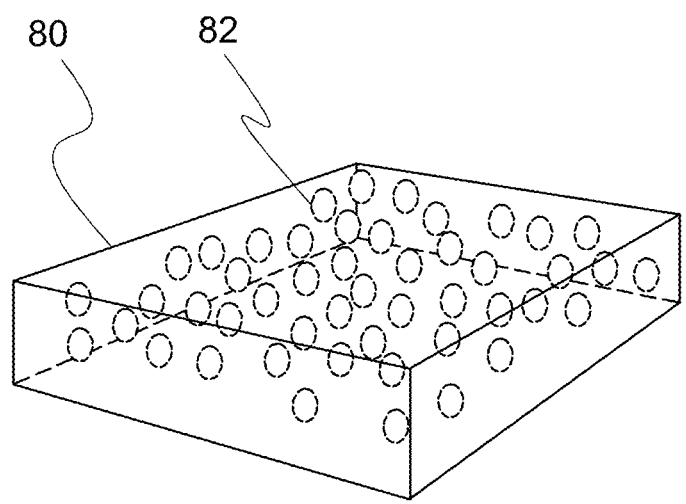
FIG. 10 is a schematic diagram of the mixture of the conductive glue and the repair particles of the repair particle layer of the present invention.
Figure 11:
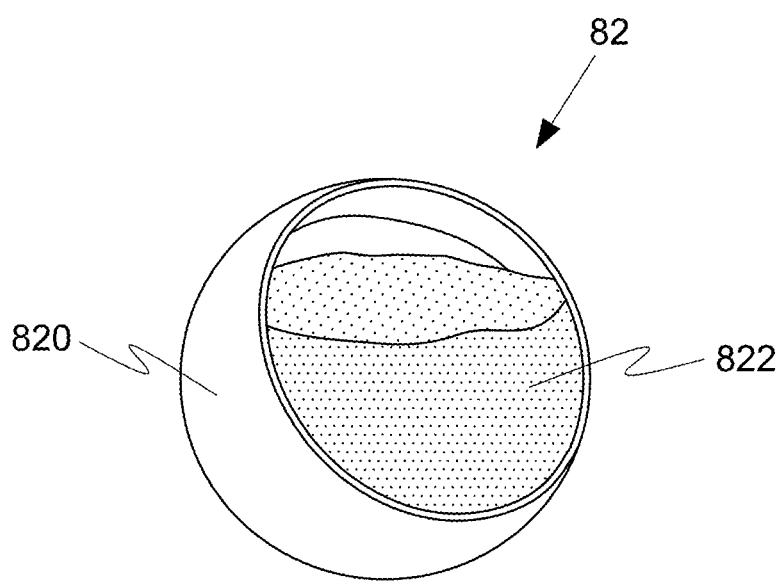
FIG. 11 is a three-dimensional schematic diagram of the repair particles of the present invention.

Although the stretch-resistant unit 4 has the capacity of stretch resistance, the stretch-resistant unit 4 may still be broken accidentally during the stretching process and results in a disconnected state. Therefore, in the present invention, please refer to FIG. 9, the surface of each stretch-resistant unit 4 is provided with a repair particle layer 8, which is composed of conductive glue 80 and repair particles 82 (as shown in FIG. 10). The repair particle 82 comprises a shell 820 and a core 822. The core 822 is wrapped by the shell 820 (as shown in FIG. 11). Alternatively, each stretch-resistant unit 4 and connected wire 40 is composed of conductive glue 80 and repair particles 82. The repair particles 82 comprises a shell 820 and a core 822, and the core 822 is wrapped by the outer shell 820.

In the present invention, the conductive glue 80 is silver glue. The shell 820 is organic polymer or metal oxide, and the core 822 is a conductive material that melting point is within the temperature of stretching process. The conductive material can be gallium, gallium indium alloy, tin-bismuth alloy, or carbon black. The proportion of repaired particles in the repair particle layer is 10-30 vol %.

Figure 12:
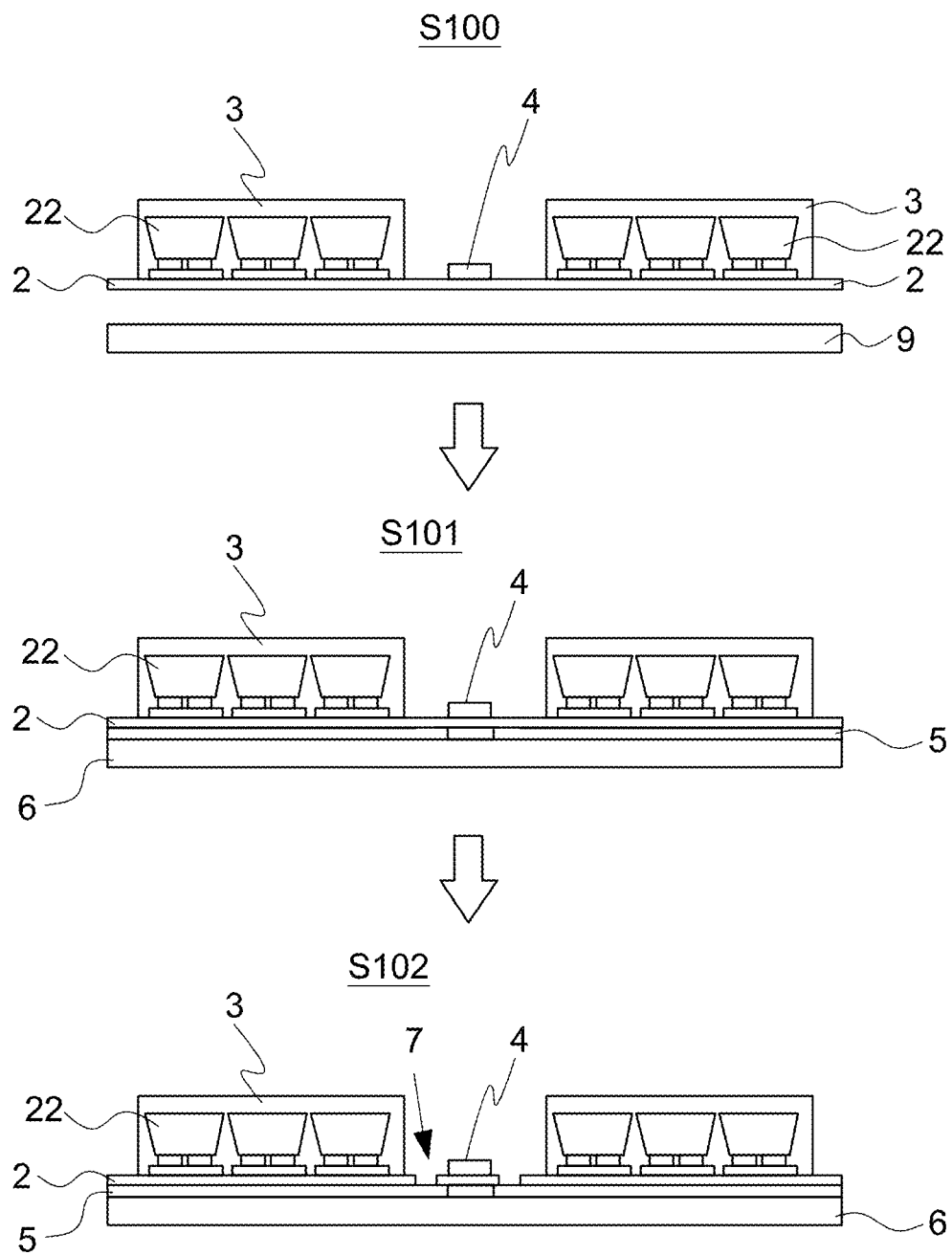
FIG. 12 is a schematic diagram of the display manufacturing process of the present invention.

Refer to FIG. 12, the present invention is a display manufacturing method comprising the following steps:

S101: The other side of the thin film substrate 2 is connected to the substrate 6 by the adhesive layer 5;

S102: A patterned area 7 is respectively arranged around each stretch-resistant unit 4

In the present invention, because the light-emitting element 22, the stretch-resistant unit 4, the packaging layer 3 cannot be directly disposed on the thin film substrate 2, the other side of the thin film substrate 2 is required to connect to the carrier board first, and then the light-emitting elements 22, the stretch-resistant unit 4, and the packaging layer 3 can be disposed on the thin film substrate 2. Before the thin film substrate 2 is connected to the substrate 6 by the adhesive layer 5, the carrier board connected to the other side of the thin film substrate 2 is required to be removed (as step S100). The carrier board is usually made of glass.

Figure 13:
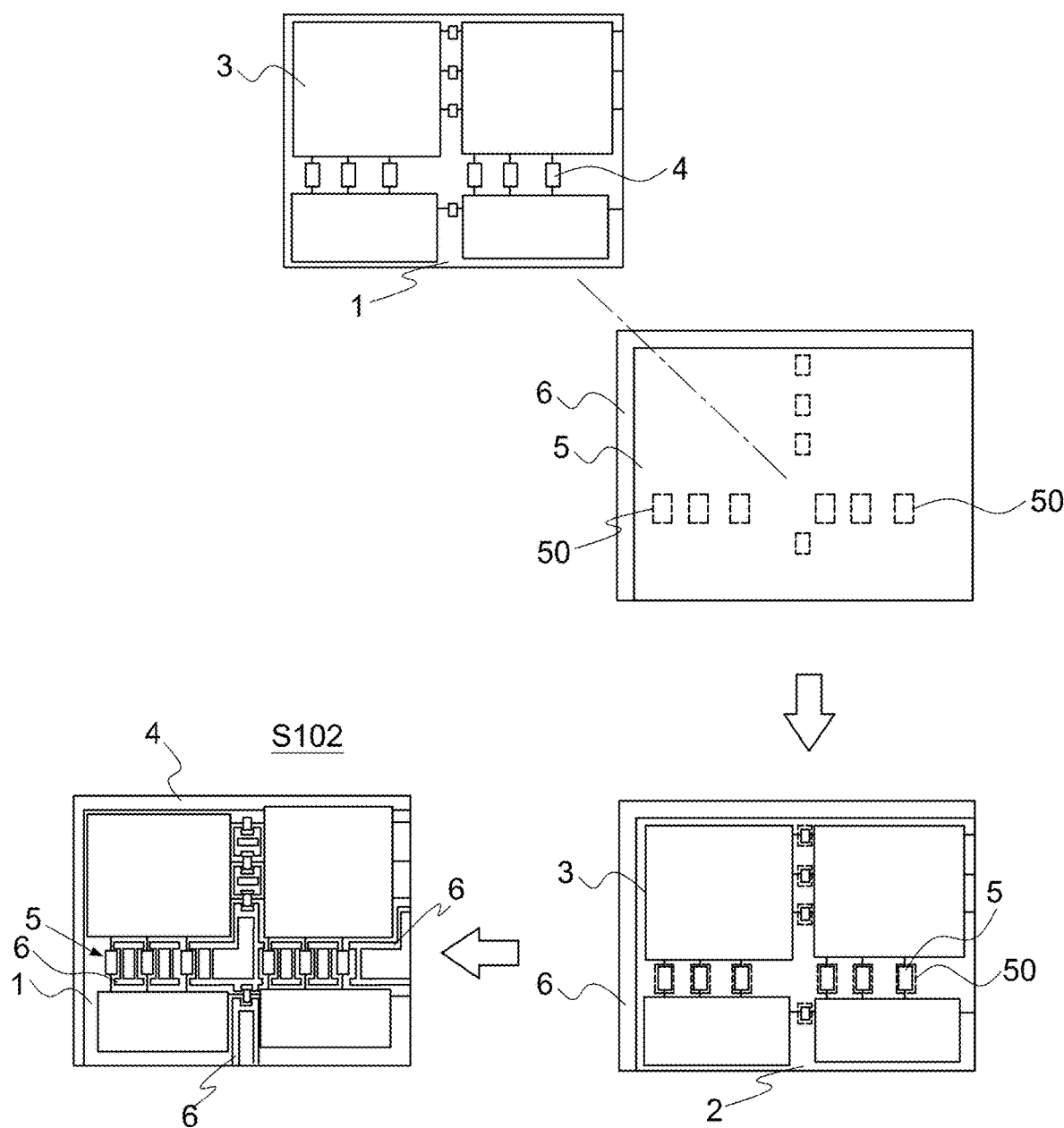
FIG. 13 is a schematic diagram of the manufacturing process of the weak adhesiveness area setting for the display of the present invention.

In the present invention, refer to FIG. 13, in order to equip the stretch-resistant unit 4 with better capability of stretch-resistant during the stretching process, the adhesive layer 5 corresponds to the position of the stretch-resistant unit 4 to forms a weak adhesiveness area 50 through a adhesiveness reduction process before the adhesive layer 5 is connected to the thin film substrate 2. The adhesiveness of each weak adhesiveness area 50 is lower than that of other parts of the adhesive layer 5. The adhesiveness reduction process is to perform etching or lasering to reduce the adhesiveness of the adhesive layer 5 corresponding to the position of each stretch-resistant unit 4, and then proceed step S102.

In the present invention, in order to improve the resistance to stretch, the thin film substrate 2 surrounding each stretch-resistant unit 4 is removed by a removal process to form a patterned area 7. It allows each stretch-resistant unit 4 and the adhesive layer 5 below to form the independent laminated structure and eliminates the problem that each stretch-resistant unit 4 is limited by the surrounding thin film substrate 2.

Figure 9:
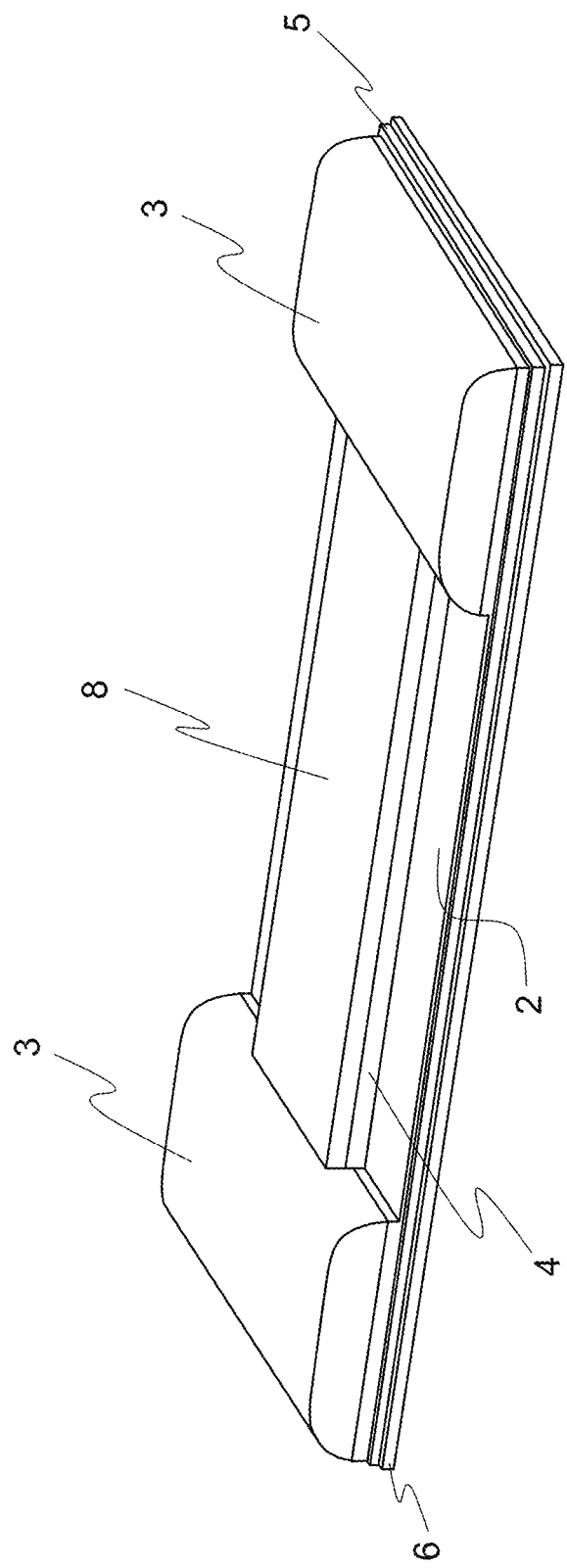
FIG. 9 is a three-dimensional schematic diagram of the repair particle layer provided on the surface of the stretch-resistant unit of the present invention.

Please refer to FIG. 9, the surface of the stretch-resistant unit 4 is coated by a repair particle layer 8. While the stretch-resistant unit is broken and becomes disconnected state due to stretching, the repair particle layer 8 repairs the disconnection position and restored stretch-resistant unit to the path state. In the present invention, a micron precision spraying machine is used to coat the repair particle layer 8 on the partial surface of the stretch-resistant unit 4, or the entire surface of the stretch-resistant unit 4 is coated by a yellow lighting process.

Figure 14:
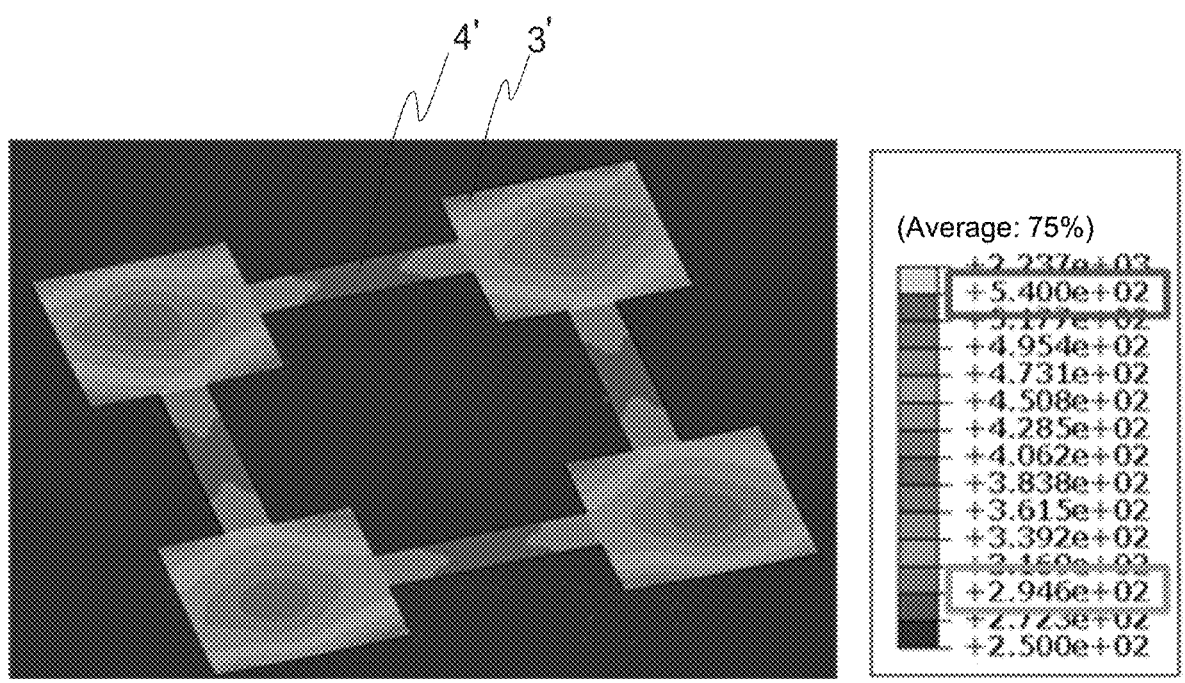
FIG. 14 is a stimulation diagram of the stress distribution of a traditional display.
Figure 15:
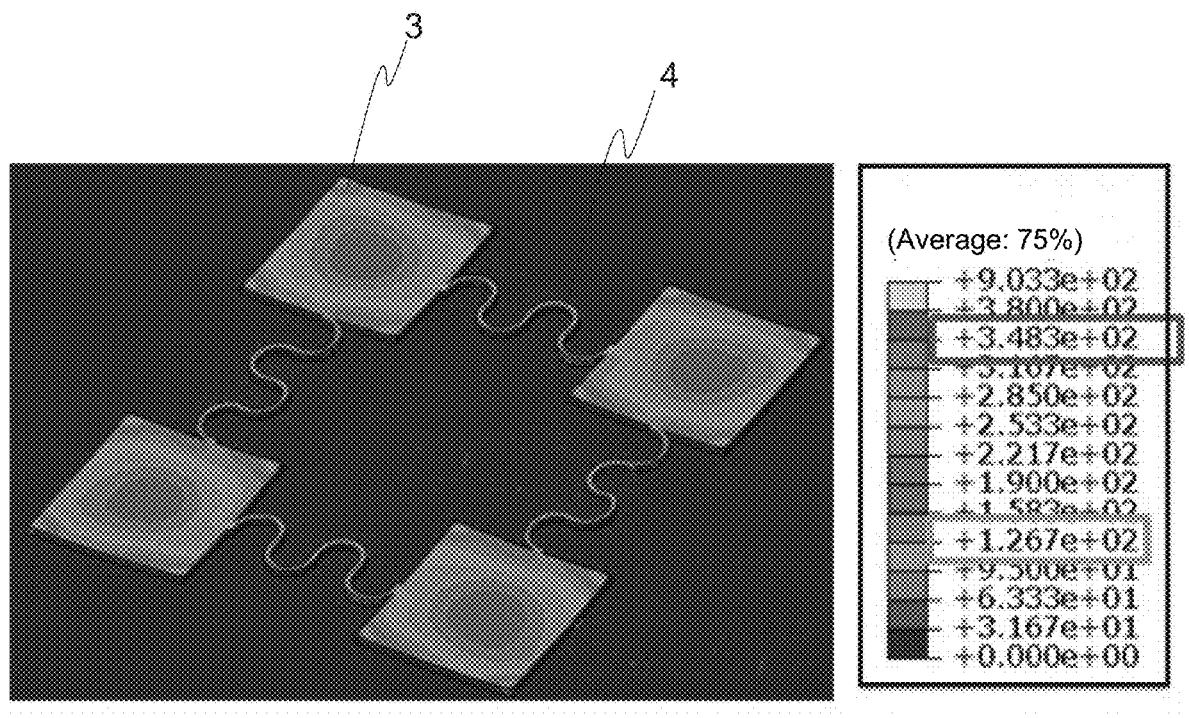
FIG. 15 is a stimulation diagram of the stress distribution of the display of the present invention.

In order to prove that the present invention can reduce the stress on the island-shape structure and increase stretch resistance, the applicant conducted a stretch simulation test. The traditional display and the display of the present invention are placed in the same jig and applied a pressure of 0.2 MPa. By forming the desired shape and observing the stress distribution diagrams of both displays, it is found that the maximum stress on the island-shape structure formed by packaging layer 3 for traditional display is 517 MPa (as shown in FIG. 14), and the maximum stress of the island-shape structure formed by the packaging layer 3 of the display of the present invention is 348 MPa (as shown in FIG. 15). The comparison shows that the present invention reduces stress about 32% and it can effectively alleviate stress concentration inside the island-shape structure.

In addition, the maximum stress between the metal wires 4 of traditional display is 294 MPa, and the maximum stress of the stretch-resistant unit 4 of the present invention is 126 MPa. The maximum stress of the stretch-resistant unit 4 of the present invention is relatively reduced by 57% in comparison with the maximum stress of the traditional metal wire 4. It effectively reduces the stress on the display and decrease the risk of splitting for island-shape structure.

Figure 16:
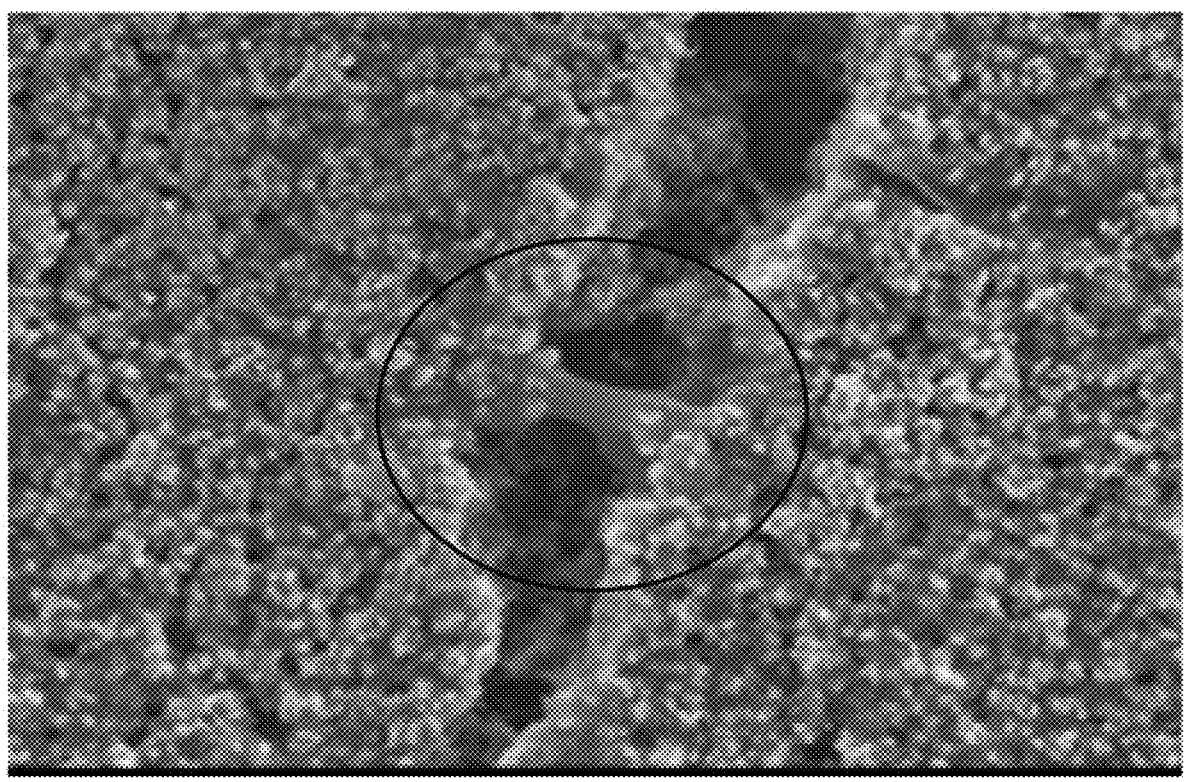
FIG. 16 is an electron microscope photograph of the repair particle layer of the present invention.
Figure 17:
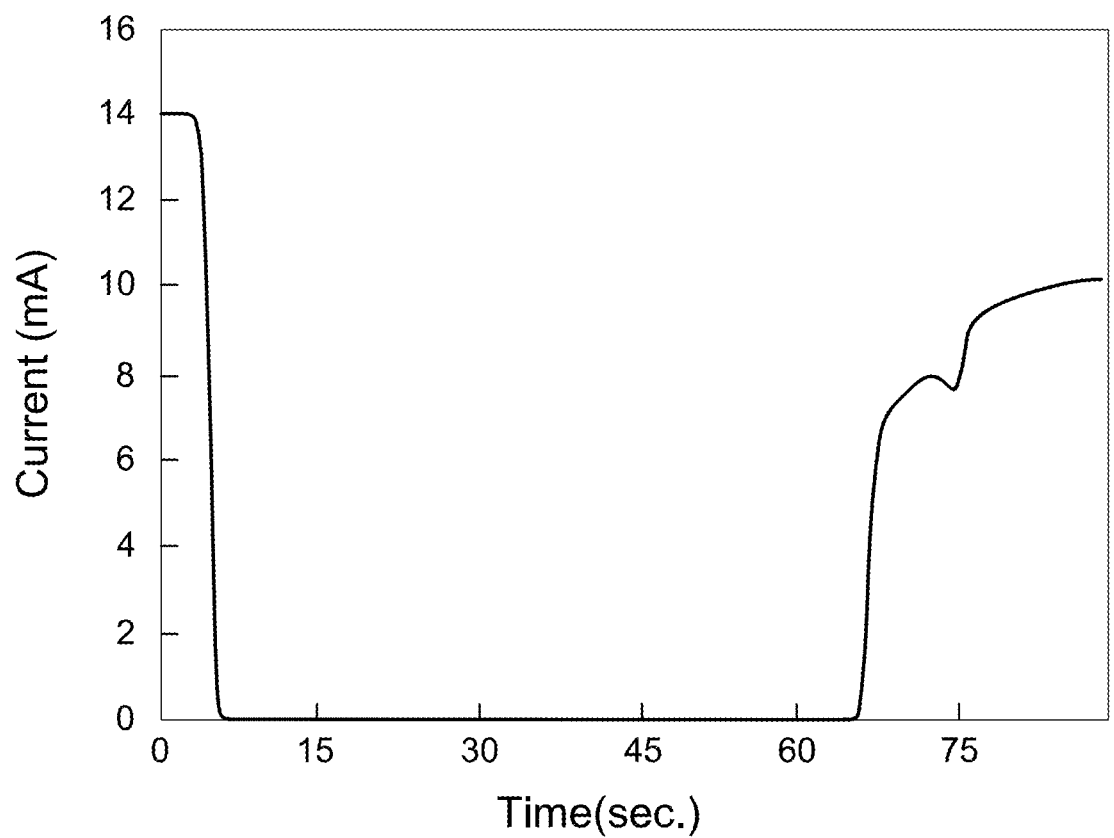
FIG. 17 is a current measurement diagram of the stretch-resistance unit of the present invention in the duration of before and after breaking.

Moreover, the applicant of the present invention also conducts the experiment to prove whether the stretch-resistant unit 4 can be repaired by the repair particle layer 8 to form a path state after the stretch-resistant unit 4 is broken. The inventor coated the stretch-resistant unit 4 with the repair particle layer 8 and then performed the electron microscope photography while the stretch-resistant unit is broken. From the circled location in FIG. 16, it can be observed that a core 822 (conductive material) is connected to the broken part of the stretch-resistant unit 4. In addition, as shown in FIG. 17, the stretch-resistant unit 4 breaks and present in the disconnected state. After waiting for about 64 seconds, stretch-resistant unit 4 is restored to the path state. It shows that the repair particle layer 88 can repair the stretch-resistant unit 4.

To sum up, the stretch-resistant unit 4 of the display of the present invention shows the better capacity of stretch-resistance in the shaping (stretching) process. Moreover, while each stretch-resistant unit 4 is stretched and broken into a disconnected state, the core 822 will fill the position where the stretch-resistant unit 4 is stretched and broken, repair the stretch-resistant unit 4, and restore it to the path state. This solves the problem that the LED of display in the prior art is damaged by stress from various directions.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A display, comprising:
   a thin film substrate, wherein a first surface of the thin film substrate has a plurality of pixel areas containing at least one light-emitting element, and the light-emitting element has a first electrode and a second electrode bonding with the thin film substrate;
   a plurality of packaging layers, each of the plurality of packaging layers respectively covering one of the plurality of pixel areas to form an island-shape structure, and any two of the adjacent island-shape structures are separated by a spacing; and
   a plurality of stretch-resistant units, each of the plurality of stretch-resistant units being respectively arranged at one of the spacings of the thin film substrate and connecting the two adjacent island-shape structures, wherein each of the plurality of stretch-resistant units comprises at least one wire, and each wire extends to the island-shape structure and connects the at least one light-emitting element therein; and wherein each of the plurality of pixel areas comprises a plurality of sub-pixel portions, and each of the plurality of sub-pixel portions is provided with a blue light-emitting element, a green light-emitting element, and a red light-emitting element, each of the first electrodes of the light-emitting elements with a same color in different sub-pixel portions of the pixel areas being connected to each other to form a plurality of first connecting units, each of the second electrodes of the light-emitting elements with different colors in the same sub-pixel portions of the pixel areas being connected to each other to form a plurality of second connection units, and the first connection units and the second connection units being respectively connected to the at least one wire.

2. A display, comprising:
   a thin film substrate, wherein a first surface of the thin film substrate has a plurality of pixel areas containing at least one light-emitting element, and the light-emitting element has a first electrode and a second electrode bonding with the thin film substrate;
   a plurality of packaging layers, each of the plurality of packaging layers respectively covering one of the plurality of pixel areas to form an island-shape structure, and any two of the adjacent island-shape structures are separated by a spacing; and
   a plurality of stretch-resistant units, each of the plurality of stretch-resistant units being respectively arranged at one of the spacings of the thin film substrate and connecting the two adjacent island-shape structures, wherein each of the plurality of stretch-resistant units is a metal wire with wavy shapes on both sides by expanding a plurality of reaming holes to an edge of both sides of a linear metal wire.

3. The display according to claim 2, wherein each of the plurality of stretch-resistant units is surrounded by a patterned area that is a sink, and each stretch-resistant unit is accommodated in the sink.

4. The display according to claim 3, wherein the patterned area is either a plurality of perforations or a plurality of pits.

5. The display according to claim 2, wherein the thin film substrate is connected to a substrate by an adhesive layer.

6. The display according to claim 2, wherein a surface of the plurality of stretch-resistant units is provided with a repair particle layer.

7. The display according to claim 6, wherein the repair particle layer is composed of a conductive glue and a plurality of repair particles, and the repair particle comprises a shell and a core, and the core is wrapped in the shell.

8. The display according to claim 1, wherein each of the plurality of stretch-resistant units and each wire connected thereto are composed of a conductive glue and a plurality of repair particles, and the repair particles comprises a shell and a core, and the core is wrapped in the shell.

9. A display manufacturing method, comprising the following steps:
   connecting a second surface of the thin film substrate of the display recited by claim 1 to a substrate through an adhesive layer;
   arranging a patterned area respectively around each of the plurality of stretch-resistant units.

10. The display manufacturing method according to claim 9, wherein before the thin film substrate is connected to the substrate by the adhesive layer, removing a preset carrier board on the second surface of the thin film substrate.

11. The display manufacturing method according to claim 9, wherein the surrounding of the plurality of stretch-resistant units is etched or lasered to remove the adhesive layer from a surface of the substrate and form the patterned area.

12. The display manufacturing method according to claim 9, wherein a surface of the plurality of stretch-resistant units is coated with a repair particle layer.

13. The display manufacturing method according to claim 12, wherein the repair particle layer is composed of a conductive glue and a plurality of repair particles, the repair particle comprising a shell and a core, and the core made of non-conductive material is wrapped in the shell made of conductive material.

14. The display manufacturing method according to claim 9, wherein each stretch-resistant unit and the connected wire are formed by coating the thin film substrate with a conductive glue containing a plurality of repair particles, the repair particle comprising a shell and a core, and the core made of non-conductive material is wrapped in the shell made of conductive material.

* * * * *